United States Patent [19]

Bayerer

[11] Patent Number: 5,748,456
[45] Date of Patent: May 5, 1998

[54] POWER SEMICONDUCTOR MODULE SYSTEM

[75] Inventor: Reinhold Bayerer, Reichelsheim, Germany

[73] Assignee: Asea Brown Boveri AG, Baden, Switzerland

[21] Appl. No.: 562,453

[22] Filed: Nov. 24, 1995

[51] Int. Cl.$^6$ ...................................................... H05K 7/00
[52] U.S. Cl. .......................... 261/820; 361/728; 257/691; 257/678; 363/132
[58] Field of Search .................................... 361/870, 728, 361/679, 729, 730, 783; 257/678, 691, 693, 723; 363/147, 132

[56] References Cited

U.S. PATENT DOCUMENTS

| | | | |
|---|---|---|---|
| 5,459,356 | 10/1995 | Schulze et al. | 257/773 |
| 5,471,089 | 11/1995 | Nagatomo et al. | 257/691 |
| 5,541,453 | 7/1996 | Stockmeier et al. | 257/723 |
| 5,604,674 | 2/1997 | Terasawa | 363/147 |

FOREIGN PATENT DOCUMENTS 0 205 746  12/1986  European Pat. Off.
0 597 144   5/1994  European Pat. Off.

OTHER PUBLICATIONS

ABB Semiconductors Inc., T. Stockmeier, et al., pp. 1–13, "Reliable 1200 AMP 2500 V IGBT Modules for Traction Applications".

*Primary Examiner*—Leo P. Picard
*Assistant Examiner*—Anthony Dinkins
*Attorney, Agent, or Firm*—Oblon, Spivak, McClelland, Maier & Neustadt, P.C.

[57] ABSTRACT

A power semiconductor module system includes a plurality of types of power semiconductor modules (310), which each contain one or more controllable power semiconductors (36, 37) and are each accommodated in a module housing (311) with power connections (313–317) and control connections which are passed to the outside, as well as a drive unit (325) for each of the power semiconductor modules (310), which drive unit (325) is accommodated in a separate housing (334) and can be detachably connected to the associated power semiconductor module in such a manner that the drive signals which are passed from the drive unit (325) at appropriate control signal outputs pass to the corresponding control connections of the power semiconductor module, the control connections of the power semiconductor modules (310) each being arranged in a first fixed-position three-dimensional configuration, and the control signal outputs of the drive units (325) each being arranged in a second fixed-position three-dimensional configuration which is superimposed on the first configuration.

In the case of such a module system, a reduction is achieved on the drive side for the cost of storage and installation in that the first and second configurations are the same for all the power semiconductor modules (310) and drive units (325) and in that the various power semiconductor modules (310) and drive units (325) are distinguished by different wiring of the control connections and control signal outputs.

20 Claims, 5 Drawing Sheets ific Field

The present invention refers to the field of power electronics. It relates to a power semiconductor module system, comprising a plurality of types of power semiconductor modules, which each contain one or more controllable power semiconductors and are each accommodated in a module housing with power connections and control connections which are passed to the outside, as well as a drive unit for each of the power semiconductor modules, which drive unit is accommodated in a separate housing and can be detachably connected to the associated power semiconductor module in such a manner that the drive signals which are passed from the drive unit at appropriate control signal outputs pass to the corresponding control connections of the power semiconductor module, the control connections of the power semiconductor modules each being arranged in a first fixed-position three-dimensional configuration, and the control signal outputs of the drive units each being arranged in a second fixed-position three-dimensional configuration which is superimposed on the first configuration.

2. Prior Art

High-power IGBT modules for use in traction (electric locomotives etc.), which are accommodated in a module housing and can be connected or screwed to a separate gate drive module for driving have already been proposed by the inventor in the article by T. Stockmeier et al. "Reliable 1200 Amp 2500 V IGBT Modules for Traction Applications", IEE IGBT Propulsion Drives Colloquium, London, Apr. 25, 1995. The configurations, which are matched to one another, of the control connection on the power semiconductor module and of the control signal outputs on the drive unit make it possible for the drive unit, with its housing, to be placed on and firmly screwed to the module housing of the power semiconductor module in a simple manner, the necessary electrical connections between the drive unit and the power semiconductor module being produced by means of simple screw connections.

This article refers to the fact that, in addition to the 1200 A/2500 V module described there with a single power semiconductor (which actually comprises a plurality of relatively small parallel-connected IGBTs and, in addition, is also connected to a reverse-parallel-connected diode), half-bridge modules are also provided having two independently drivable power semiconductors or complete 3-phase bridge modules with 6 power semiconductors. All the modules are in this case intended to have the same "footprint", that is to say they are intended to be interchangeable in terms of dimensions and mounting options. The physical form of the known modules and of the associated drive units is in general comparable with the illustrations in FIGS. 1 and 2.

The use of a standard physical form for various modules having a different internal design (individual switches, half-bridge, full-bridge etc.) has already led in the prior art to standardization in terms of the design of bridge circuits and the like, which standardization reduces the installation cost and simplifies storage (of connecting parts, coolers which can be attached etc.). However, problems result on the drive side, because each module requires a different type of drive, depending on the internal design. For example, in the case of the module having a single semiconductor, only one gate need be driven, while in the case of the module having a half-bridge two need to be driven. Furthermore, the modules having a single semiconductor may also exist in two different configurations, depending on whether they are intended to form the upper part or the lower part of a half-bridge.

PRESENTATION OF THE INVENTION

The object of the invention is now to produce a system of power semiconductor modules in the case of which it is possible to achieve a reduction in the cost for storage and installation, on the drive side.

In the case of a power semiconductor module system of the type mentioned initially, the object is achieved in that the first and second configurations are the same for all the power semiconductor modules and drive units, and in that the various power semiconductor modules and drive units are distinguished by the different wiring of the control connections and control signal outputs. As a result of the standardization of the connection configuration on the drive side, it is possible to implement different parts of power semiconductor bridges by means of a different internal design of the power semiconductor module and drive unit, without having to dispense with the advantages of a standard connection technique. The standard connection configuration already intrinsically provides considerable simplification irrespective of whether the various power semiconductor modules are or are not otherwise present in a standard physical form.

A first preferred embodiment of the system according to the invention is distinguished by the fact that the module housings and the housings of the drive units are in each case the same for all the power semiconductor modules and drive units, in that the power connections of the power semiconductor modules are in each case arranged in a third fixed-position three-dimensional configuration, in that the third configuration is the same for all the power semiconductor modules and in that the various power semiconductor modules are distinguished by different wiring of the power connections. Still further simplification results from the standardization, going beyond the drive side, of the modules and drive units.

The system is particularly favorable in the application if, according to a second preferred embodiment, the system comprises at least three types of power semiconductor modules which are suitable in particular for forming bridge circuits, the first type being a power semiconductor module having a half bridge which is formed from two power semiconductors, the second type being a power semiconductor module having a single power semiconductor which can be used for one bridge arm of a half bridge, and the third type is a power semiconductor module having a single power semiconductor which can be used for the other bridge arm of a half bridge, and if the control connections and the control signal outputs of the drive units in the first and/or second configuration are arranged rotationally symmetrically around an axis of symmetry, if, in the case of the second type and third type of power semiconductor module, the only control connections which are in each case wired up are those such that the control connections which are wired up in the case of the second type merge, by rotation through a selected angle of symmetry about the axis of symmetry, into the control connections which are wired up in the case of the third type, and if the same drive unit can be used for both types of power semiconductor modules, which drive unit is connected in the case of the second type in a first three-dimensional arrangement to the respective power semiconductor module and in the case of the third type in a second three-dimensional arrangement to the respective power semiconductor module, the two arrangements being distinguished by rotation through the selected angle of symmetry about the axis of symmetry. As a consequence of this, it is possible to use the same drive unit to drive two different module types, which drive unit is in each case connected to the module only in a different three-dimensional arrangement.

Further embodiments result from the dependent claims.

BRIEF EXPLANATION OF THE FIGURES

It is intended to explain the invention in more detail in the following text with reference to exemplary embodiments and in conjunction with the drawing, in which:

FIG. 2 shows various side views of a module according to FIG. 1 with a drive unit screwed on;

WAYS TO IMPLEMENT THE INVENTION

Figure 1:
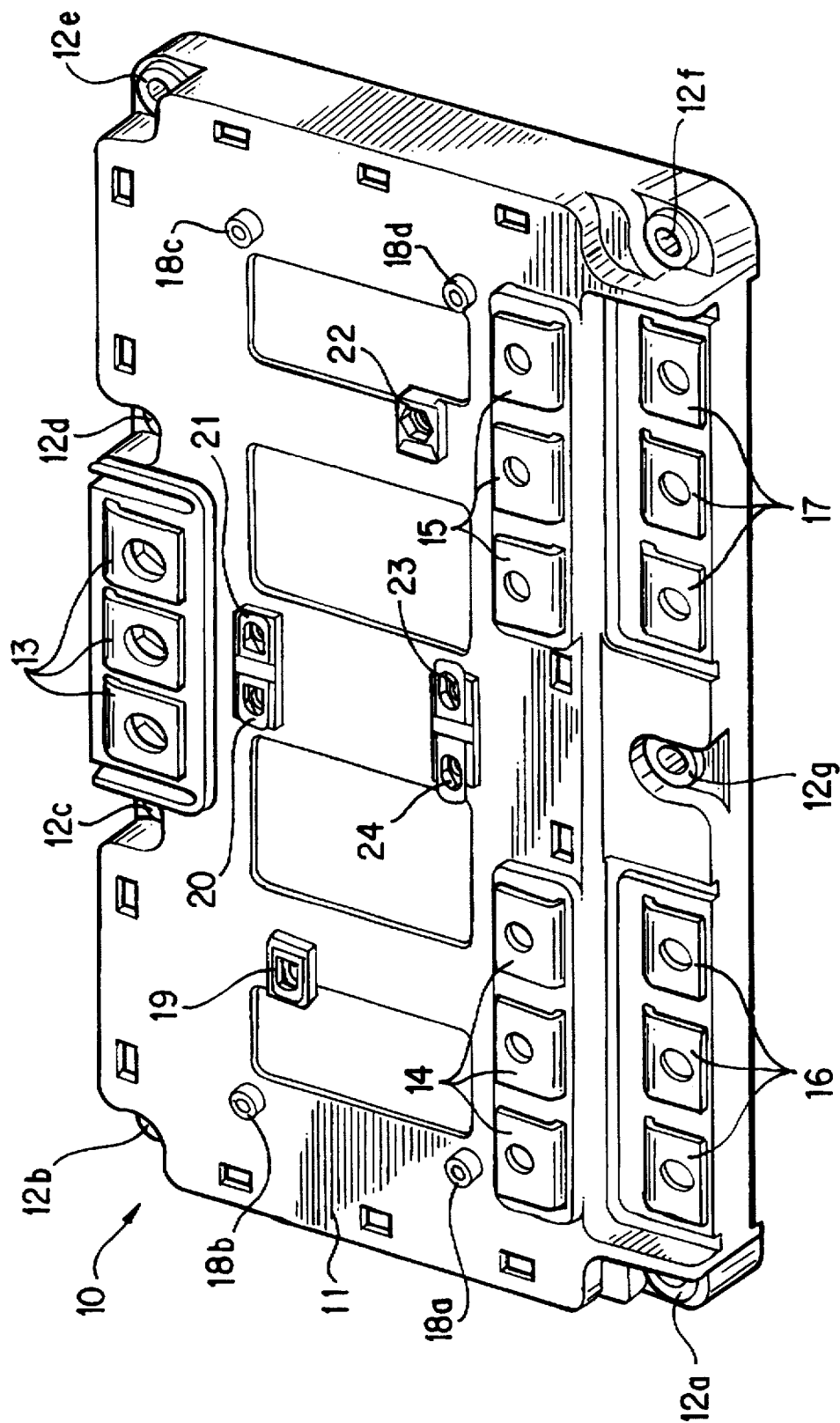
FIG. 1 shows a perspective [sic] illustration of a preferred exemplary embodiment of the physical form and arrangement of the connections of a power semiconductor module according to the invention.

FIG. 1 shows a perspective [sic] illustration of a preferred exemplary embodiment of the physical form and arrangement of the connections of a power semiconductor module according to the invention. The power semiconductor module 10 is accommodated in a flat casing-like module housing 11 which is made of electrically insulating plastic. Reference is made to the initially mentioned article as an example of the internal design. The module housing 11 can be mounted on a suitable base by means of mounting holes 12a–g which are arranged distributed on the circumference. All the connections for the electrical connection of the internal power semiconductors to an external circuit are provided on the top of the module. The connections comprise a plurality of power connections 13 to 17, which each comprise three interconnected connecting tabs which are passed upward out of the housing 11 and are bent parallel to the housing surface. Lock nuts are in each case incorporated underneath the connecting tabs, into which lock nuts a connecting screw can be screwed, through a round hole which is provided in the tabs.

Figure 3:
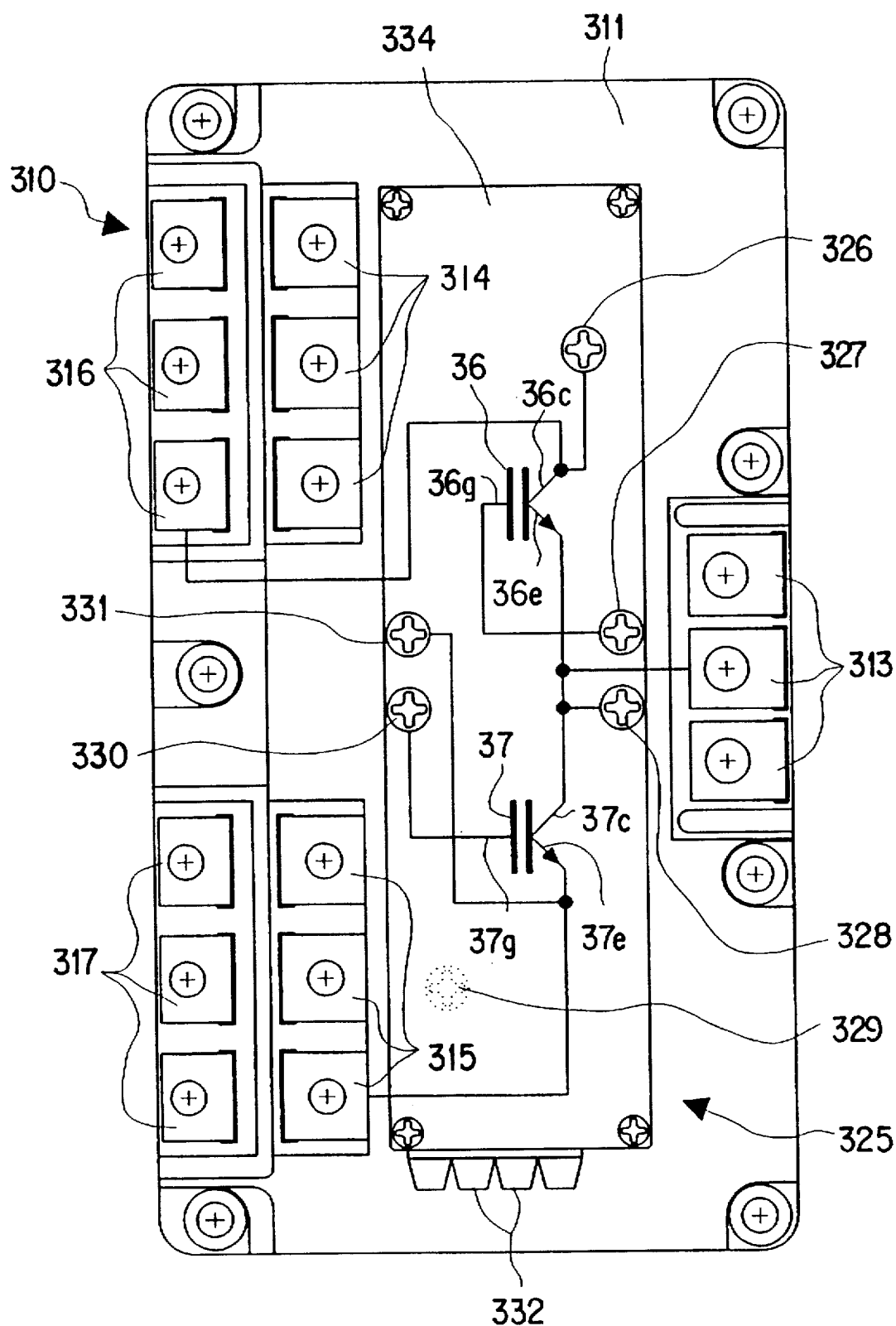
FIG. 3 shows a schematic illustration of a preferred exemplary embodiment of a half-bridge module with two individual semiconductors, and the connection layout on the drive side and power side.

In the case of a module having an internal half-bridge, the power connection 13 is connected to the phase output (center tap) of the half-bridge (cf. the power connection 313 in FIG. 3). If the power semiconductor module 10 is fitted internally with only a single semiconductor, the power connection 13 is not wired up and thus has no function (cf. power connections 413 and 513 in FIG. 4 and FIG. 5 respectively). The power connections 14 and 15 as well as 16 and 17 respectively are in each case connected to one another and each form a sextuple connection on different planes of the module. Depending on the internal design of the module, the positive or negative electrode of a power semiconductor, in the case of IGBTs the collector or the emitter, is connected to each sextuple connection. The connection layout which is preferred in the context of the invention will be explained later in more detail in conjunction with FIGS. 3, 4 and 5.

Figure 2:
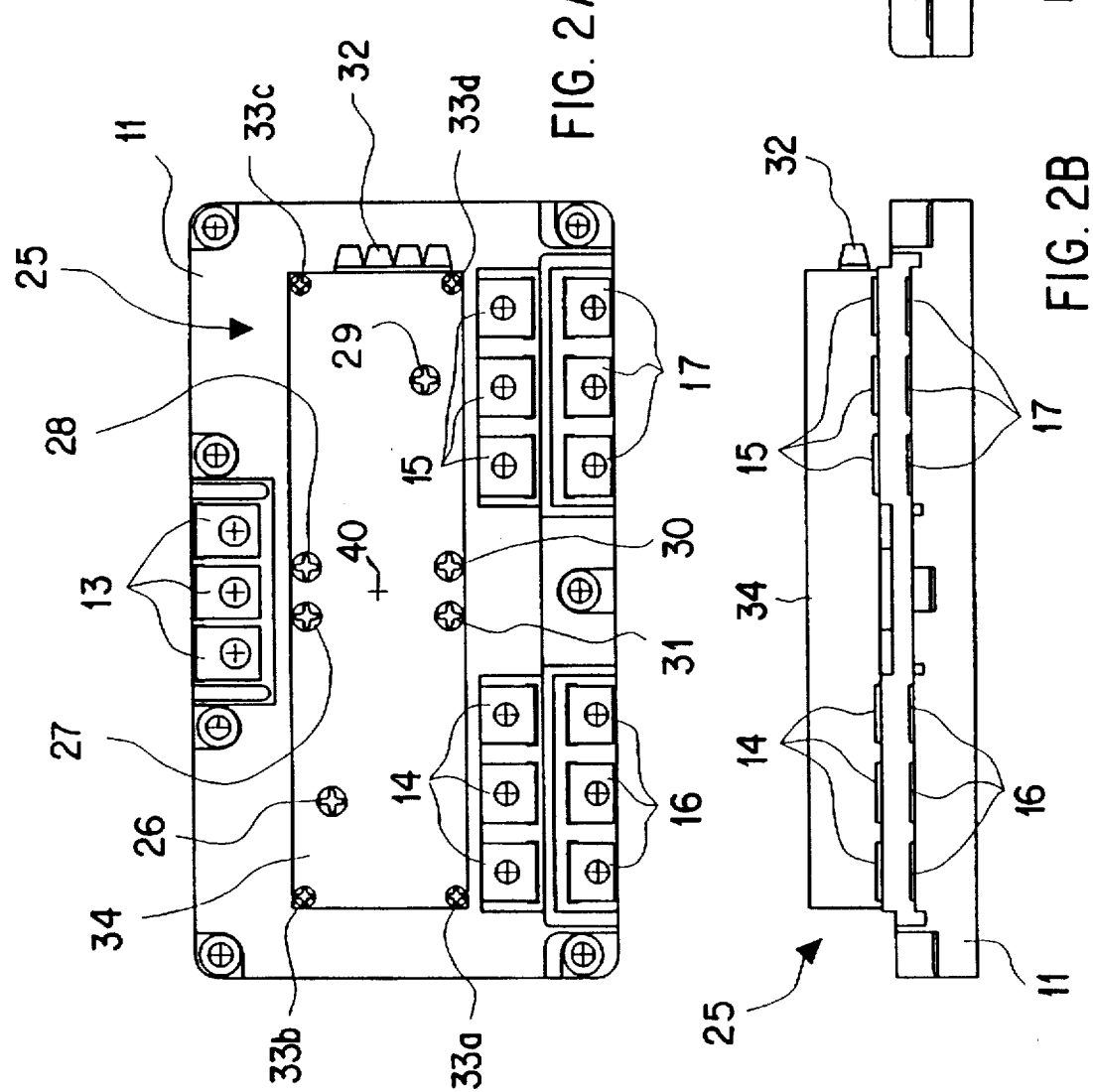

In a predetermined first configuration, control connections 19 to 24 are arranged in a mutually insulated manner in the center region of the module 10 between the power connections 13 on the one hand and the power connections 14, 15 on the other hand and can likewise be made contact with by screwing connecting screws (for example 26 to 31 in FIG. 2) into corresponding nuts. The control connections 19 to 24 are located within a rectangle defined by 4 threaded posts 18a–d. According to FIG. 2, a compact drive unit 25, which is accommodated in a separate housing 34, can be screwed onto the power semiconductor module 10 by means of the threaded posts 18a–d. The corresponding mounting screws 33a–d can be seen in the plan view in FIG. 2(a). Control signal outputs are provided on the underneath, facing the module, of the drive unit 25 (not visible in the Figures) and are arranged—seen from above—in the same configuration as the control connections 19 to 24 on the top of the power semiconductor module 10. In principle, one control signal output is assigned to each of the control connections 19 to 24 and comes to rest over the associated control connection when the drive unit 25 is fitted onto the module 10, and is electrically connected to the control connection by means of a connecting screw 26 (for control connection 19) to 31 (for control connection 24), which is screwed into the control connection through the drive unit 25. A plurality of (fiber-optic) control signal connections as well as a DC supply connection 35 (FIG. 2(c)) for the electronics of the drive unit 25 are arranged at the side of the drive unit 25. The logic control commands are passed from [sic] optical fibers to the drive unit 25 via the control signal connections 32 and are processed there to produce control signals (gate signals) for the power semiconductors fitted in the module.

Figure 4:
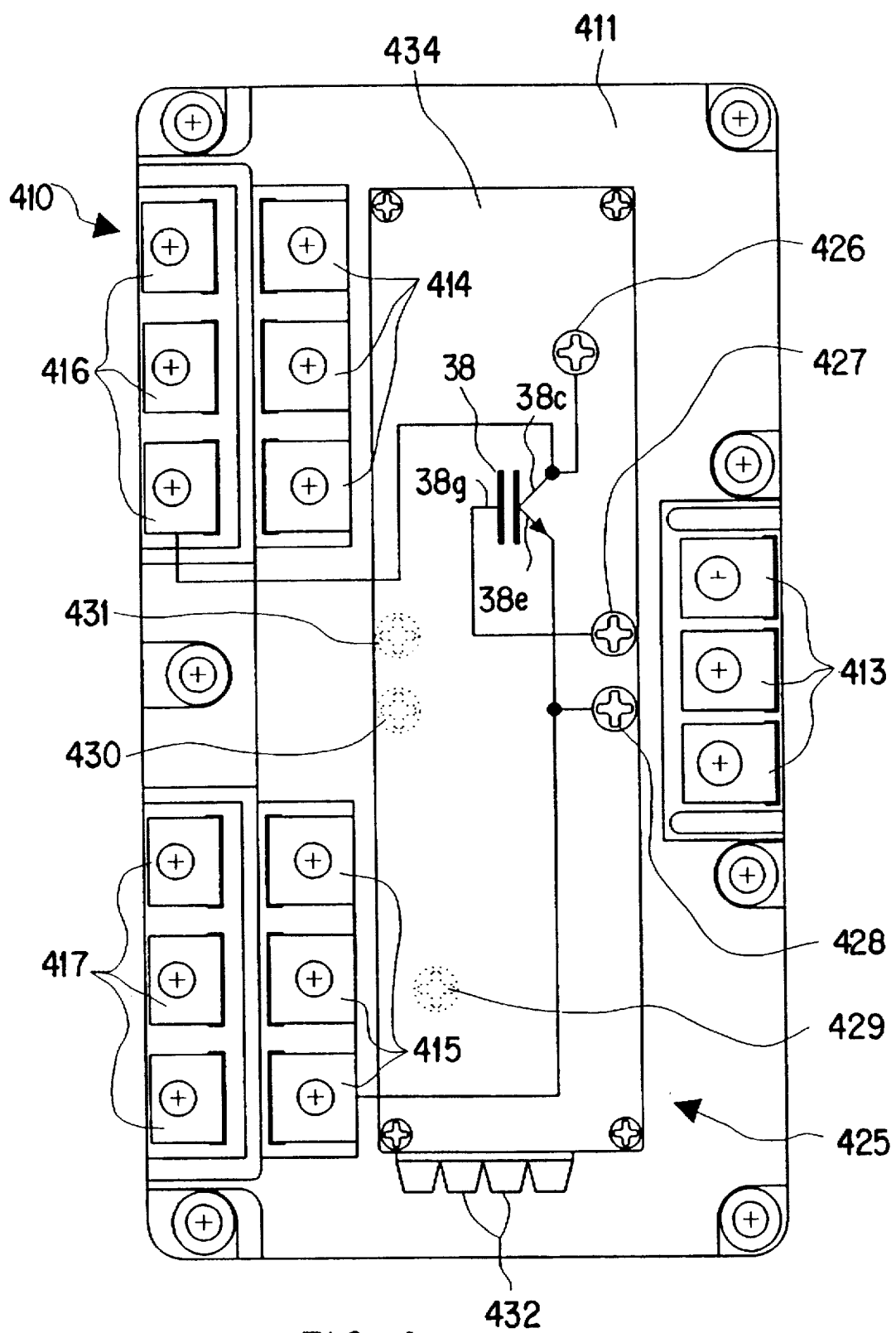
FIG. 4 shows a schematic illustration of a preferred exemplary embodiment of a module having an individual semiconductor for one arm of a half-bridge and the associated connection layout on the drive side and power side.
Figure 5:
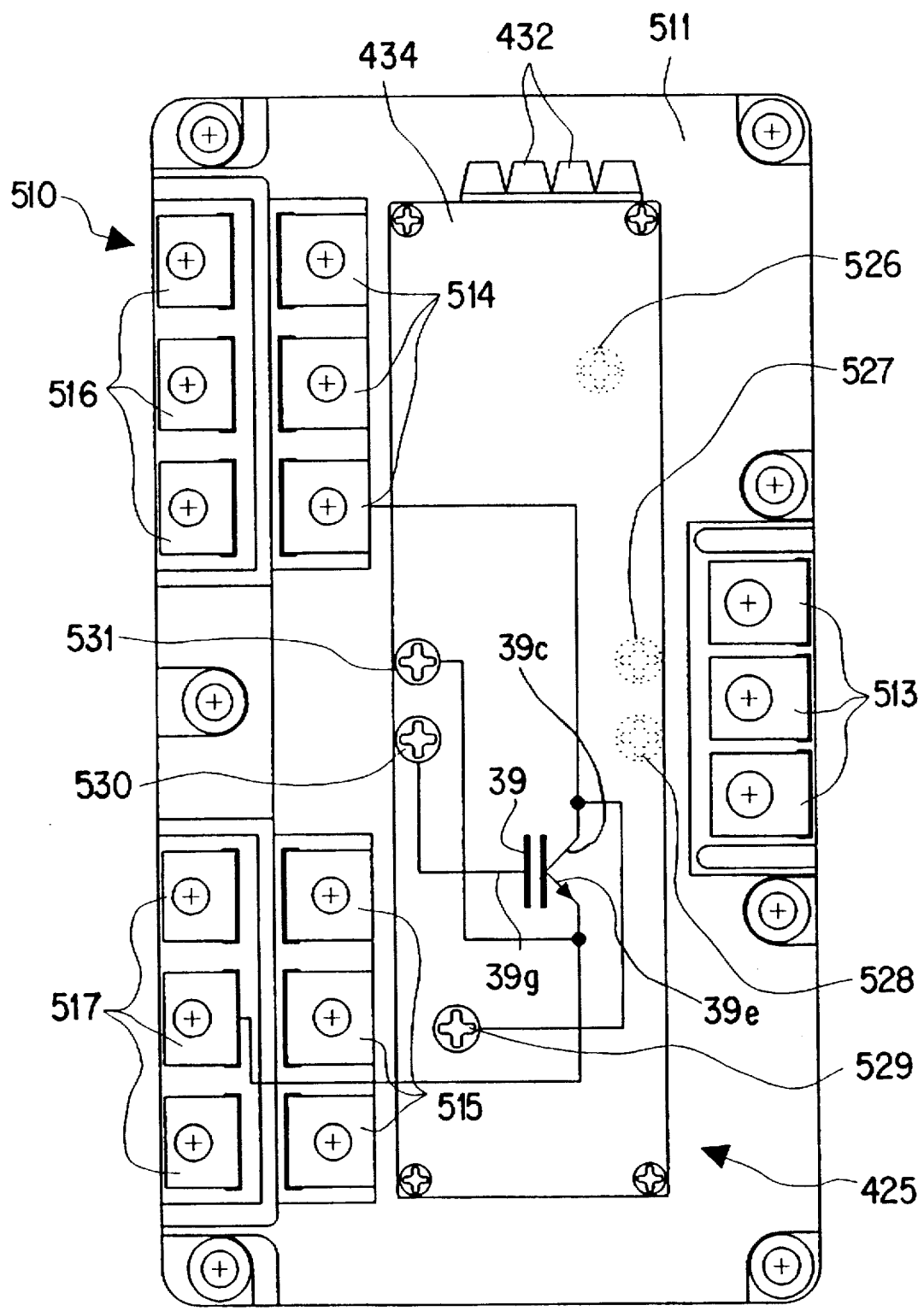
FIG. 5 shows a schematic illustration of a preferred exemplary embodiment of a module having an individual semiconductor for the other arm of a half-bridge as well as the associated connection layout on the drive side and power side.

The total of 6 control connections 19 to 24 (FIG. 1) and the associated connecting screws 26 to 31 (FIG. 2(a)) are positioned in a rotationally symmetrical manner around the axis of symmetry (40 in FIG. 2(a)). The angle of symmetry is in this case 180°. If the configuration of the control connections 19 to 24 or of the connecting screws 26 to 31 is rotated through 180° about this axis of symmetry 40, the control connection 19 assumes precisely the position of the control connection 22, the control connection 20 the position of the control connection 23, and the control connection 21 the position of the control connection 24, and vice versa. The same applies in the same sense to the connecting screws 26 to 31 and to the control signal outputs (which cannot be seen) on the underneath of the drive unit 25. It can thus be confirmed that, if the drive unit 25 on the module 10 is rotated through 180° about the axis of symmetry 40, the control signal outputs in turn come to rest over the control connections 19 to 24, with the difference that the assignment between the control signal outputs and the control connections is cyclically interchanged. This cyclic interchanging plays a major role if it is intended to use the same drive unit for different modules with single semiconductors (FIGS. 4 and 5).

FIG. 3 shows the connection layout for a preferred embodiment of a module according to the invention having two power semiconductors in a half-bridge arrangement. The power semiconductor module 310, with the module housing 311 and the power connections 313 to 317, has the same physical form and connection configuration as the module 10 in FIGS. 1, 2. The control connections, which correspond to the control connections 19 to 24 of the module 10 in FIG. 1, are covered by the drive unit 325, which is placed thereon, with its housing 334 and the control signal connections 332. Two IGBTs (Insulated Gate Bipolar Transistors) 36 and 37 are provided as power semiconductors inside the module 310 and are shown with their connections in the form of a circuit diagram. The IGBTs 36 and 37 each have a gate 36g, 37g, a collector 36c, 37c, and an emitter 36e, 37e. Since the control connections are themselves covered, the IGBTs 36 and 37 in FIG. 3 are symbolically connected to the associated connecting screws 326 to 331, which are screwed into the control connections (19–24 in FIG. 1) and produce the connection to the drive unit. The connecting screw 326 in this case corresponds to the control connection 19 in FIG. 1, the connecting screw 327 to the control connection 20, etc.

The IGBTs 36 and 37 are connected to one another within the power semiconductor module 310 to form a half-bridge. The emitter 36e of the first (upper) IGBT is connected to the connector 37c of the second (lower) IGBT for this purpose. The connection between the first emitter 36e and the second collector 37c is connected to the power connection 313, which forms the phase output of the half-bridge. The connection is at the same time connected to that control connection to which the connection screw 328 is assigned (21 in FIG. 1). This control connection forms an auxiliary emitter with respect to the first IGBT 36 and at the same time an auxiliary collector with respect to the second IGBT 37. The collector 36c of the first IGBT 36 is connected to the power connection 316, 317, which form the "+" connection of the half-bridge 36, 37. The emitter 37e of the second IGBT 37 is connected to the power connections 314, 315 which form the "–" connection of the half-bridge. The collector 36c of the first IGBT 36 is furthermore connected to that control connection to which the connecting screw 326 is assigned (19 in FIG. 1). This control connection forms an auxiliary collector with respect to the first IGBT 36. The emitter 37e of the second IGBT 37 is additionally connected in a corresponding manner to that control connection to which the connection screw 331 is assigned (24 in FIG. 1). This control connection forms an auxiliary emitter with respect to the second IGBT 37. Finally, the gates 36g and 37g of the two IGBTs are each connected to a control connection to which the connecting screw 327 or 330 respectively is assigned (20 or 23 respectively in FIG. 1).

If the gate connections are included among the auxiliary connections, the half-bridge of the power semiconductor module 310 in FIG. 3 thus has a total of three main connections 316, 317 and/or 313 and/or 314, 315 and five auxiliary connections (connecting screws 326, 327, 328, 330 and 331). The auxiliary connections are connected to the drive unit 325 via the connecting screws. That connection which is assigned to the connecting screw 329 (22 in FIG. 1) is not wired up because two auxiliary connections, namely the auxiliary emitter of the first IGBT 36 and the auxiliary collector of the second IGBT 37, are jointly connected via the one connecting screw 328.

Using the same physical form of the power semiconductor module and the drive unit, other module types can now also be implemented in a simple manner. These include, in particular, the power semiconductor modules 410 and 510, which are illustrated in FIGS. 4 and 5, each have a single semiconductor and can easily be connected to one another to form a half-bridge by means of external wiring of the module. The module in FIG. 4 in this case forms a so-called plus module, that is to say a module which represents the upper half of a half-bridge according to FIG. 3. The module in FIG. 5 is correspondingly a minus module and is used to implement the lower half of a half-bridge according to FIG. 3.

The plus module (power semiconductor module 410) in FIG. 4 contains a single IGBT 38 in a module housing 411 whose physical form is identical to the module housing 311 in FIG. 3, the collector 38c of which IGBT 38 is connected to the power connections 416, 417 in the same way as the first IGBT 36 in FIG. 3. The emitter 38e is connected to the power connections 414, 415, which correspond to the power connections 314, 315 in FIG. 3. The power connections 413 are not wired up and can thus be omitted.

The drive unit 425, with the housing 434 and the control signal connections 432, has the same physical form as the drive unit 325 in FIG. 3. In principle, 6 auxiliary connections can also be connected by connecting screws 426 to 431 in the case of the drive unit 425, which auxiliary connections assume the same three-dimensional configuration as the control connections 19 to 24 in FIG. 1 and the connecting screws 326 to 331 in FIG. 3. Since, however, only a single semiconductor has to be driven in the present case, those control connections in the module 410 which correspond to the connecting screws 429, 430 and 431 (indicated by dots) are not wired up and are not taken into account in the drive unit 425, that is to say the drive unit 410 for the single semiconductor is produced in the same physical form as the drive unit 310 for the half-bridge, but the components of the lower arm are not fitted. Thus, corresponding to FIG. 3, a connection is made from the collector 38c of the IGBT 38 to the control connection of the connecting screw 426 as an auxiliary collector, a connection is made from the emitter 38e to the control connection of the connecting screw 428 as an auxiliary emitter, and a connection is made from the gate 38g to the control connection of the connecting screw 427 as a gate connection.

An analogous situation results for the minus module which is shown in FIG. 5 (power semiconductor module 510). Once again, an IGBT 39 in a power semiconductor module 510 is used here as a single semiconductor, said power semiconductor module 510 with its module housing 511 and the power connections 513 to 516 being identical in terms of physical form with the modules in FIGS. 3 and 4. The collector 39c of the IGBT 39 is connected to the power connections 514, 515, and its emitter 39e is connected to the power connections 516, 517. Since—as can be seen in FIG. 1—the power connections 514, 515 and 516, 517 are on different levels in the module, the collector 39c of a module according to FIG. 5 on the same level can very easily be connected by means of this connection configuration to the emitter 38e of a module according to FIG. 4, in order to form a complete half-bridge. Once again, the power connections 513 are not wired up here and can thus be omitted. On the drive side, the IGBT 39 is connected in a similar manner as the second IGBT 37 in FIG. 3: the emitter 39e is connected as an auxiliary emitter to the control connection for the connecting screw 531 and the control connection of the gate 39g is connected to the connecting screw 530. In this case, as a difference from FIG. 3, the collector 39c is connected to the control connection for the connecting screw 529 in order to form an auxiliary collector.

The special feature in the case of the two single semiconductor modules 410 and 510 is, therefore, that the same drive unit can be used, in a different three-dimensional arrangement, for both module types because of the rotationally symmetrical arrangement of the control connections and connecting screws 426–431 and 526–531 respectively. In the case of the power semiconductor module 410 in FIG. 4

(plus module), the drive unit 425 is oriented and screwed onto the module such that the control signal outputs, which are wired up internally in the drive unit, can be connected by means of the connecting screws 426, 427 and 428 to the auxiliary collector (38c) [sic], the gate 38g and the auxiliary emitter (38e) [sic] of the IGBT 38. The control signal connections 432 in this case come to rest at the bottom.

In the case of the power semiconductor module 510 in FIG. 5 (minus module), the drive unit 425 is screwed onto the module rotated through 180°, so that the same control signal outputs, which are wired up internally in the drive unit, can be connected by means of the connecting screws 529, 430 [sic] and 430 [sic] in an analogous manner to the auxiliary connector (39c) [sic], the gate 39g and the auxiliary emitter (39e) [sic] of the IGBT 38 [sic]. The control signal connections 432 in this case come to rest at the top. In this way, a system of power semiconductor modules with associated drive units for the formation of semiconductor bridges is produced within the context of the invention, which semiconductor bridges are distinguished by a uniform, standardized physical form, can easily be combined with one another, and manage with a small number of different drive units.

LIST OF DESIGNATIONS

| | |
|---|---|
| 10, 310, 410, 510 | Power semiconductor module |
| 11, 311, 411, 511 | Module housing |
| 12a–g | Mounting hole |
| 13–17 | Power connection |
| 18a–d | Threaded posts |
| 19–24 | Control connection |
| 25, 325, 425 | Drive unit |
| 26–31 | Connecting screw |
| 32, 332, 432 | Control signal connection |
| 33a–d | Mounting screw (Drive unit) |
| 34, 334, 434 | Housing (Drive unit) |
| 35 | Supply connection |
| 36, 37 | IGBT (Half-bridge) |
| 36c, 37c | Collector |
| 36e, 37e | Emitter |
| 36g, 37g | Gate |
| 38, 39 | IGBT (single) |
| 38c, 39c | Collector |
| 38e, 39e | Emitter |
| 38g, 39g | Gate |
| 40 | Axis of symmetry |
| 313–317 | Power connection |
| 326–331 | Connecting screw |
| 413–417 | Power connection |
| 426–431 | Connecting screw |
| 513–517 | Power connection |
| 526–531 | Connecting screw |

I claim:

1. Power semiconductor module system, comprising a plurality of types of power semiconductor modules which each contain one or more controllable power semiconductors and are each accommodated in a module housing with power connections and control connections which are passed to the outside, as well as a drive unit for each of the power semiconductor modules, which drive unit is accommodated in a separate housing and can be detachably connected to the associated power semiconductor module in such a manner that the drive signals which are passed from the drive unit at appropriate control signal outputs pass to the corresponding control connections of the power semiconductor module, the control connections of the power semiconductor modules each being arranged in a first fixed-position three-dimensional configuration, and the control signal outputs of the drive units each being arranged in a second fixed-position three-dimensional configuration which is superimposed on the first configuration, characterized in that the first and second configurations are the same for all the power semiconductor modules and drive units and in that the various power semiconductor modules and drive units are distinguished by the different wiring of the control connections and control signal outputs.

2. Power semiconductor module system according to claim 1, characterized in that the module housings and the housings of the drive units are in each case the same for all the power semiconductor modules and drive units.

3. Power semiconductor module system according to claim 2, characterized in that the power connections of the power semiconductor modules are in each case arranged in a third fixed-position three-dimensional configuration, in that the third configuration is the same for all the power semiconductor modules and in that the various power semiconductor modules are distinguished by different wiring of the power connections.

4. Power semiconductor module system according to one of claim 1, characterized in that the system comprises at least three types of power semiconductor modules which are suitable in particular for forming bridge circuits, the first type being a power semiconductor module having a half bridge which is formed from two power semiconductors, the second type being a power semiconductor module having a single power semiconductor which can be used for one bridge arm of a half bridge, and the third type is a power semiconductor module having a single power semiconductor which can be used for the other bridge arm of a half bridge.

5. Power semiconductor module system according to claim 4, characterized in that the control connections and the control signal outputs of the drive units in the first and/or second configuration are arranged rotationally symmetrically around an axis of symmetry, in that, in the case of the second type and third type of power semiconductor module the only control connections which are in each case wired up are those such that the control connections which are wired up in the case of the second type merge, by rotation through a selected angle of symmetry about the axis of symmetry into the control connections which are wired up in the case of the third type and in that the same drive unit can be used for both types of power semiconductor modules, which drive unit is connected in the case of the second type in a first three-dimensional arrangement to the respective power semiconductor module and in the case of the third type in a second three-dimensional arrangement to the respective power semiconductor module, the two arrangements being distinguished by rotation through the selected angle of symmetry about the axis of symmetry.

6. Power semiconductor module system according to claim 5, characterized in that the selected angle of symmetry is 180°.

7. Power semiconductor module system according to one of claim 1, characterized in that the control connections of the power semiconductor modules and the control signal outputs of the drive units can in each case be electrically connected to one another by means of screw connections.

8. Power semiconductor module system according to one of claim 1, characterized in that the controllable power semiconductors are designed as IGBTs.

9. Power semiconductor module system according to claim 2, characterized in that the system comprises at least three types of power semiconductor modules which are suitable in particular for forming bridge circuits, the first type being a power semiconductor module having a half bridge which is formed from two power semiconductors, the second type being a power semiconductor module having a single power semiconductor which can be used for one bridge arm of a half bridge, and the third type is a power semiconductor module having single power semiconductor which can be used for the other bridge arm of a half bridge.

10. Power semiconductor module system according to claim 3, characterized in that the system comprises at least three types of power semiconductor modules which are suitable in particular for forming bridge circuits, the first type being a power semiconductor module having a half bridge which is formed from two power semiconductors, the second type being a power semiconductor module having a single power semiconductor which can be used for one bridge arm of a half bridge, and the third type is a power semiconductor module having single power which can be used for the other bridge arm of a half bridge.

11. Power semiconductor module system according to claim 2, characterized in that the control connections of the power semiconductor modules and the control signal outputs of the drive units can in each case be electrically connected to one another by means of screw connections.

12. Power semiconductor module system according to claim 3, characterized in that the control connections of the power semiconductor modules and the control signal outputs of the drive units can in each case be electrically connected to one another by means of screw connections.

13. Power semiconductor module system according to claim 4, characterized in that the control connections of the power semiconductor modules and the control signal outputs of the drive units can in each case be electrically connected to one another by means of screw connections.

14. Power semiconductor module system according to claim 5, characterized in that the control connections of the power semiconductor modules and the control signal outputs of the drive units can in each case be electrically connected to one another by means of screw connections.

15. Power semiconductor module system according to claim 6, characterized in that the control connections of the power semiconductor modules and the control signal outputs of the drive units can in each case be electrically connected to one another by means of screw connections.

16. Power semiconductor module system according to claim 2, characterized in that the controllable power semiconductors are designed as IGBTs.

17. Power semiconductor module system according to claim 3, characterized in that the controllable power semiconductors are designed as IGBTs.

18. Power semiconductor module system according to claim 4, characterized in that the controllable power semiconductors are designed as IGBTS.

19. Power semiconductor module system according to claim 5, characterized in that the controllable power semiconductors are designed as IGBTs.

20. Power semiconductor module system according to claim 6, characterized in that the controllable power semiconductors are designed as IGBTs.

* * * * *